United States Patent
Chen

(10) Patent No.: US 9,966,573 B2
(45) Date of Patent: May 8, 2018

(54) DISPLAY APPARATUS AND AN ORGANIC LIGHT-EMITTING DIODE DEVICE

(71) Applicant: Shenzhen China Star Optoelectronics Technology Co., Ltd., Shenzhen, Guangdong (CN)

(72) Inventor: Lixuan Chen, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 249 days.

(21) Appl. No.: 14/913,365

(22) PCT Filed: Dec. 29, 2015

(86) PCT No.: PCT/CN2015/099373
§ 371 (c)(1),
(2) Date: Feb. 21, 2016

(87) PCT Pub. No.: WO2017/084177
PCT Pub. Date: May 26, 2017

(65) Prior Publication Data
US 2018/0040853 A1    Feb. 8, 2018

(30) Foreign Application Priority Data

Nov. 19, 2015   (CN) .......................... 2015 1 0808947

(51) Int. Cl.
*H01L 29/08*    (2006.01)
*H01L 51/52*    (2006.01)

(52) U.S. Cl.
CPC ...... *H01L 51/5275* (2013.01); *H01L 51/5209* (2013.01); *H01L 51/5221* (2013.01); *H01L 2251/5353* (2013.01)

(58) Field of Classification Search
CPC ............. H01L 51/5275; H01L 51/5209; H01L 51/5221
USPC ...................................... 257/40, 98
See application file for complete search history.

(56) References Cited

U.S. PATENT DOCUMENTS

| 7,538,354 B2 * | 5/2009 | Hayashi | ............... H01L 51/5246 257/40 |
| --- | --- | --- | --- |
| 2005/0077820 A1 | 4/2005 | Onishi et al. | |
| 2008/0238310 A1 | 10/2008 | Forrest et al. | |
| 2013/0299792 A1 | 11/2013 | Park et al. | |

(Continued)

FOREIGN PATENT DOCUMENTS

| CN | 102034846 A | | 4/2011 |
| --- | --- | --- | --- |
| JP | 2003-243182 | * | 8/2003 |
| JP | 2003243182 A | | 8/2003 |

*Primary Examiner* — Tan N Tran
(74) *Attorney, Agent, or Firm* — Andrew C. Cheng

(57) ABSTRACT

The disclosure discloses a display apparatus and an organic light emitting diode device, wherein the organic light emitting diode device including a glass substrate, an anode layer, an organic layer and a cathode layer laminated sequentially, the refractive index of the anode layer is larger than the refractive index of the glass substrate, wherein a through hole is formed in the anode layer so that partial of the incident light from the organic layer can be extracted through the through hole to the glass substrate in order to reduce the total reflection phenomenon of the contracting surface of the anode layer and the glass substrate.

15 Claims, 3 Drawing Sheets

(56) References Cited

U.S. PATENT DOCUMENTS

2014/0131669 A1    5/2014   Park
2014/0131690 A1    5/2014   Kondo et al.

* cited by examiner

DISPLAY APPARATUS AND AN ORGANIC LIGHT-EMITTING DIODE DEVICE

FIELD OF THE INVENTION

The present disclosure relates to the field of semiconductor technology, and in particularly to an organic light emitting diode and a display apparatus using the organic light emitting diode device.

BACKGROUND OF THE INVENTION

The organic light emitting diode device generally consists of a cathode layer, an anode layer and a light emitting layer. Commonly, the material of the cathode layer is aluminum, Al or the like metal material, and the material of the anode layer is indium tin oxide, ITO and other materials. The electrons and holes are injected from the cathode and anode and stimulate to formation of exciton luminescence of the luminescent layer in the organic light-emitting layer. Currently the laboratory products are focus on transparent ITO anode layer, and showing the status of a top emission of the device structure, while because of the deposited ITO will destruct the organic material in the production line, and will place it at the bottom often, so that the bottom emission structure is adapted, and the light is emitted from the cathode layer.

As most of the organic light emitting diode device using an anode emitting structure currently, the excitation light emitted through the transparent ITO electrode and glass. In this mode, due to the inherent properties of the refractive index, the total reflection is easy to happen. As the optical path of the organic light emitting diode device shown in FIG. 1, the organic light emitting diode device includes at least an organic light-emitting layer 101, an anode layer 102 and a glass layer 103. The refractive index of the anode layer 102 is larger than the refractive index of the glass layer 103. Partial of the incident light is emitting from the organic light emitting layer 101 to the anode layer 102, and refracting in the anode layer 102, so that an angle of refraction θ2 of the light of the anode layer 102 is greater than an angle of incidence θ1. Since θ2=θ3, so that an angle of incident θ3 of the glass layer 103 becomes larger (ie, θ3 greater than θ1), even greater than or equal to the critical angle of the glass layer 103, so that the total reflection occurs in portion of the light between the glass layer 103 and the air layer, resulting the lower light extraction efficiency.

SUMMARY OF THE INVENTION

The present disclosure provides a display apparatus and an organic light-emitting diode device, in order to solve the conventional technology of the total reflection occur between the air layer and the glass layer, thus resulting the lower light extraction efficiency.

In order to solve the above problems, one approach of the present invention is used to provide an organic light emitting diode device, wherein including a glass substrate, an anode layer, an organic layer and a cathode layer laminated sequentially, wherein the refractive index of the anode layer is larger than the refractive index of the glass substrate, wherein a through hole is formed in the anode layer so that partial of the incident light from the organic layer can be extracted through the through hole to the glass substrate in order to reduce the total reflection phenomenon of the contracting surface of the anode layer and the glass substrate; a dielectric layer is formed between the anode layer and the glass substrate; the refractive index of the dielectric layer is smaller than the refractive index of the organic layer, and a via is provided in the dielectric layer corresponding to the through hole, so that the partial of the light emitted from the organic layer can pass through the through hole, the via successively and directly to the glass substrate.

According to a preferred embodiment of the present disclosure, the diameter of the through hole is between 1 mm-1000 mm.

According to a preferred embodiment of the present disclosure, there is a plurality of through holes and evenly distributed in the anode layer.

According to a preferred embodiment of the present disclosure, the refractive index of the dielectric layer is larger than the refractive index of the organic layer.

According to a preferred embodiment of the present disclosure, the total area of the plurality of the through holes is smaller than 30% of the total area of the anode layer overlapping with the glass substrate.

According to a preferred embodiment of the present disclosure, the refractive index of the organic layer is smaller than the refractive index of the anode layer.

According to a preferred embodiment of the present disclosure, the refractive index of the glass substrate is 1.45, the refractive index of the anode layer is 1.9.

In order to solve the above problems, one approach of the present invention is used to provide an organic light emitting diode device, including a glass substrate, an anode layer, an organic layer and a cathode layer laminated sequentially, wherein the refractive index of the anode layer is larger than the refractive index of the glass substrate, wherein a through hole is formed in the anode layer so that partial of the incident light from the organic layer can be extracted through the through hole to the glass substrate in order to reduce the total reflection phenomenon of the contracting surface of the anode layer and the glass substrate.

According to a preferred embodiment of the present disclosure, the diameter of the through hole is between 1 mm-1000 mm.

According to a preferred embodiment of the present disclosure, there is a plurality of through holes and evenly distributed in the anode layer.

According to a preferred embodiment of the present disclosure, a dielectric layer is formed between the anode layer and the glass substrate.

According to a preferred embodiment of the present disclosure, the refractive index of the dielectric layer is larger than the refractive index of the organic layer.

According to a preferred embodiment of the present disclosure, the refractive index of the dielectric layer is smaller than the refractive index of the organic layer, and a via is provided in the dielectric layer corresponding to the through hole, so that the partial of the light emitted from the organic layer can pass through the through hole, the via successively and directly to the glass substrate.

According to a preferred embodiment of the present disclosure, the total area of the plurality of the through holes is smaller than 30% of the total area of the anode layer overlapping with the dielectric layer.

According to a preferred embodiment of the present disclosure, the refractive index of the organic layer is smaller than the refractive index of the anode layer.

According to a preferred embodiment of the present disclosure, the refractive index of the glass substrate is 1.45, the refractive index of the anode layer is 1.9.

In order to solve the above problems, one approach of the present invention is used to provide a display apparatus including the organic light emitting diode device mentioned above. The advantage of the present disclosure to differ with the conventional technology is to provide a display apparatus and an organic light-emitting diode device, the anode layer has a through hole so that partial of the light emitted from the organic layer can pass through the through hole and directly to the glass substrate in order to reduce the total reflection phenomenon in the contacting surface of the anode layer and the of the glass substrate, thereby improving the light extraction efficiency of the organic light emitting diode device.

BRIEF DESCRIPTION OF THE DRAWINGS

The following detailed descriptions accompanying drawings and the embodiment of the present disclosure make the aspect of the present disclosure and the other beneficial effect more obvious.

DETAILED DESCRIPTION OF THE PREFERRED EMBODIMENTS

The specific components or items are used in the specification and claims. Those skilled in the art can use other possible modifications and variations in the same components or items. The specification and claim will not distinguish the different terms to the items or components but by the functions. Following is the detail description illustrated by the figures and the embodiments.

First Embodiment

Figure 1:
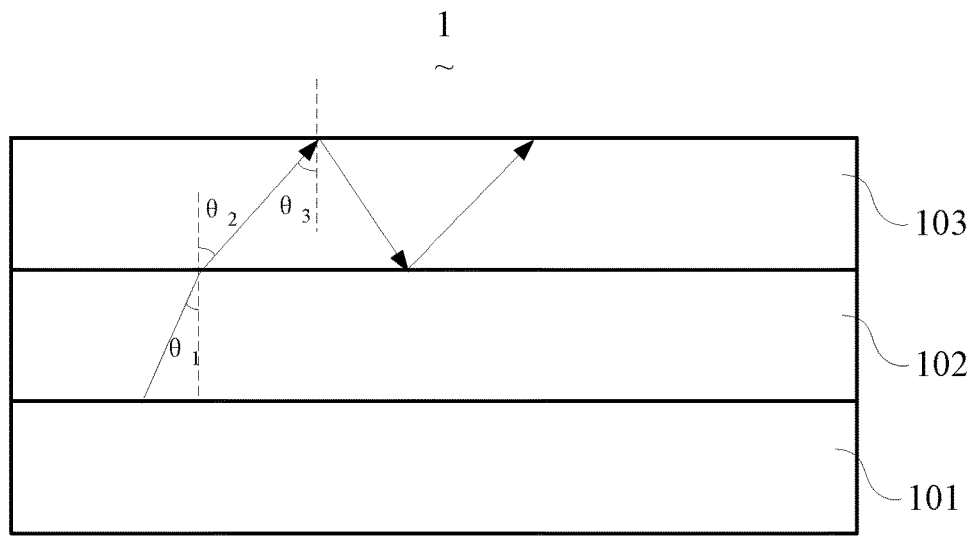
FIG. 1 illustrates partial of the optical path of the conventional organic light emitting diode device.
Figure 2:
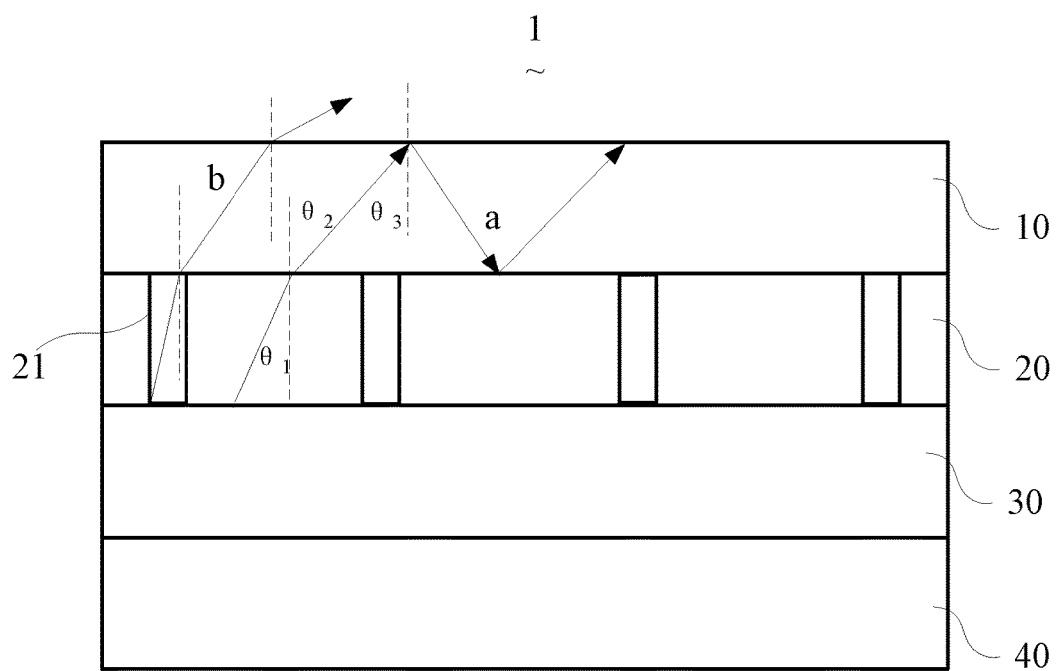
FIG. 2 is a schematic view of the organic light emitting diode device structure according to the embodiment of the present disclosure.
Figure 3:
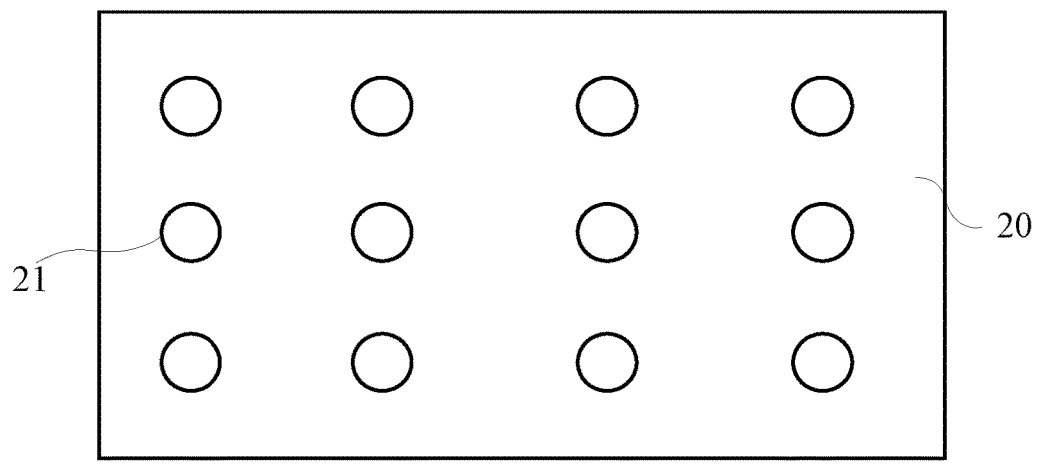
FIG. 3 is a top view of the organic light emitting diode device structure illustrated in FIG. 2 according to the embodiment of the present disclosure.

Referring to FIG. 2 and FIG. 3, FIG. 2 is a schematic view of the organic light emitting diode device structure according to the embodiment of the present disclosure and FIG. 3 is a top view of the organic light emitting diode device structure illustrated in FIG. 2 according to the embodiment of the present disclosure.

The organic light emitting diode device 1 of the present disclosure includes a glass substrate 10, an anode layer 20, an organic layer 30 and a cathode layer 40 laminated sequentially. The electrons and holes are injected from the cathode layer 40 and the anode layer 20 respectively in the present embodiment, and the excitons are formed in the organic layer 30 and excite the material of the organic light emitting layer 30 to emit light, the light excited from the organic layer 30 pass the anode layer 20, and emitted from the glass substrate 10. The refractive index $n_1$ of the anode layer 20 is larger than the refractive index $n_2$ of the glass substrate 10, wherein a through hole 21 is formed in the anode layer 20 so that partial of the incident light from the organic layer 30 can be extracted through the through hole 21 to the glass substrate 10 in order to reduce the total reflection phenomenon of the contacting surface of the anode layer 20 and the glass substrate 10.

In the other embodiment, the refractive index of the organic layer 30 can be smaller than the refractive index $n_1$ of the anode layer 20. In this case, the refractive index of the organic layer 30 can be larger or smaller than the refractive index $n_2$ of the glass substrate 10, the refractive index of air is smaller than the refractive index $n_2$ of the glass substrate 10. Generally, the refractive index of air is 1, preferably, the refractive index $n_2$ of the glass substrate 10 is 1.45, the refractive index $n_1$ of the anode layer 20 is 1.9, and of course, the refractive index of the glass substrate 10 and anode layer 20 may also be other ratios.

As illustrated in FIG. 2, there are two optical paths a, b (of course there are other optical path, because they do not the major improved part of the present disclosure, it will not be elaborated on here) of the light extracted from the organic layer 30 of the organic light emitting diode device 1. On the optical path a, partial of the incident light emitted from the organic layer 30 to the anode layer 20, and partial of the light is reflected; and partial of the incident light emitted from the anode layer 20 to the glass substrate 10, and the same partial of the light is reflected. It can be understand that an angle of refraction θ2 of the light in the anode layer 20 is larger than an exit angle θ1, since an incident angle θ3 of the glass substrate 10 is equal to the angle of refraction θ2 of the anode layer 20, so θ3 is greater than θ1, which means the incident angle θ3 of the glass substrate 10 becomes larger relatively to θ1, and the larger θ3 may even be larger than or equal to the critical angle of the glass layer 103, so that total reflection occurs in partial of the light between the glass layer 103 and the air layer, thus resulting in lower light extraction efficiency.

It can be understood that the incident angle θ3 of the glass layer 10 can be reduced to avoid total reflection phenomenon when θ3 is greater than or equal to the critical angle of the glass layer 103, such as to reduce the angle of refraction θ2. According to the law of refraction $n_1 \sin θ1 = n_2 \sin θ2$ found that when the refractive index $n_2$ of the glass substrate 10, the incidence angle θ1 is unchanged, it can be achieve the purpose of reducing the angle of refraction θ2 by decreasing the refractive index $n_1$ of the anode layer 20. In the present embodiment, the through hole 21 is formed in the anode layer 20, since the through hole 21 is formed by air, the refractive index of the air is smaller than the refractive index $n_1$ of the anode layer 20, thereby allowing the incident light by the incident angle θ3 emitting to the glass substrate 10 to reduce the total reflection phenomenon, such as the optical path b.

The diameter of the through hole 21 is between 1 mm-1000 mm, preferably, the diameter of the through hole 21 is 10 mm, 15 mm or 50 mm.

In this embodiment including a plurality of through holes 21, evenly distributed in the anode layer 20, and the number of the through holes 21 is 10 to 300. Preferably, the number of the through holes 21 is 20 to 80, the number of the through holes 21 should not be too much to affect the conductivity of the anode layer 20.

Further, the distance of the centers of the two adjacent through holes 21 is 20-100 mm; preferably, distance of the centers of the two adjacent through holes 21 is 50 mm. Of course, the through holes 21 can be provided only on one side of the anode layer 20, or the through holes 21 can be uniformly provided on the opposite sides of the anode layer 20, and the through holes 21 is not provided in the middle part.

Worthy of note is, the total area of the plurality of the through holes 21 in the present embodiment is smaller than 30% of the total area of the anode layer 20 overlapping with the glass substrate 10. Specifically, the area of the anode layer 20 of the present embodiment can be greater than or equal to the area of the glass substrate 10, the area of the anode layer 20 can be smaller than the glass substrate 10, as long as the 30% area of the anode layer 20 overlapping with the glass substrate 10 is greater than the total area of the plurality of the through holes 21 to make the anode layer 20 having enough space to inject holes at the same time, and to ensure the conductive properties of the anode layer 20.

The through hole 21 in the present embodiment can be direct through hole, it can be curved hole, it can also be spiral hole, when the through hole 21 are curved or spiral hole, the light can be through multiple reflections and then into the glass substrate 10. The through hole 21 can be circular shape, it can be equilateral triangle shape, diamond shape and other regular polygon shape, and it can also be heart-shaped or star-like shape.

The cathode layer 40 in the present embodiment can be made by the material of one or more than one selected from Ag, Al, Ca, In, Li, Mg, and the material of the anode layer 20 is indium tin oxide, ITO and other materials, and ITO is formed by a vapor deposition method.

Second Embodiment

Figure 4:
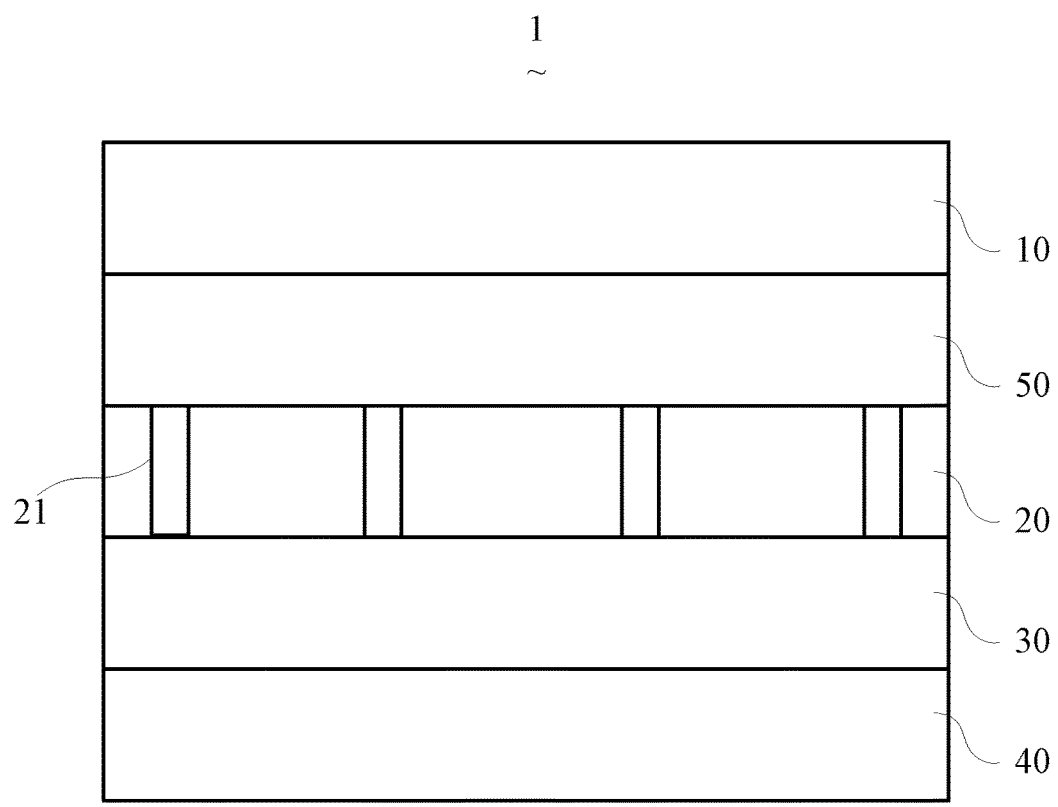
FIG. 4 is a schematic view of the organic light emitting diode device structure according to the another embodiment of the present disclosure.

Referring to FIG. 4, FIG. 4 is a schematic view of the organic light emitting diode device structure according to another embodiment of the present disclosure. The organic light emitting diode device 1 in the present embodiment is approximately the same with the first embodiment, the difference of the present embodiment is that an additional dielectric layer 50 is formed in the organic light emitting diode device 1 of the present embodiment.

Specifically, the organic light emitting diode device 1 of the present embodiment includes a glass substrate 10, a dielectric layer 50, an anode layer 20, an organic layer 30 and a cathode layer 40 laminated sequentially.

The refractive index of the anode layer 20 is larger than the refractive index of the glass substrate 10, and the refractive index of the dielectric layer 50 is larger than the refractive index of the organic layer 30, wherein a through hole 21 is formed in the anode layer 20 so that partial of the incident light from the organic layer 30 can be extracted through the through hole 21 to the dielectric layer 50 in order to reduce the total reflection phenomenon of the contracting surface of the anode layer 20 and the glass substrate 10.

Figure 5:
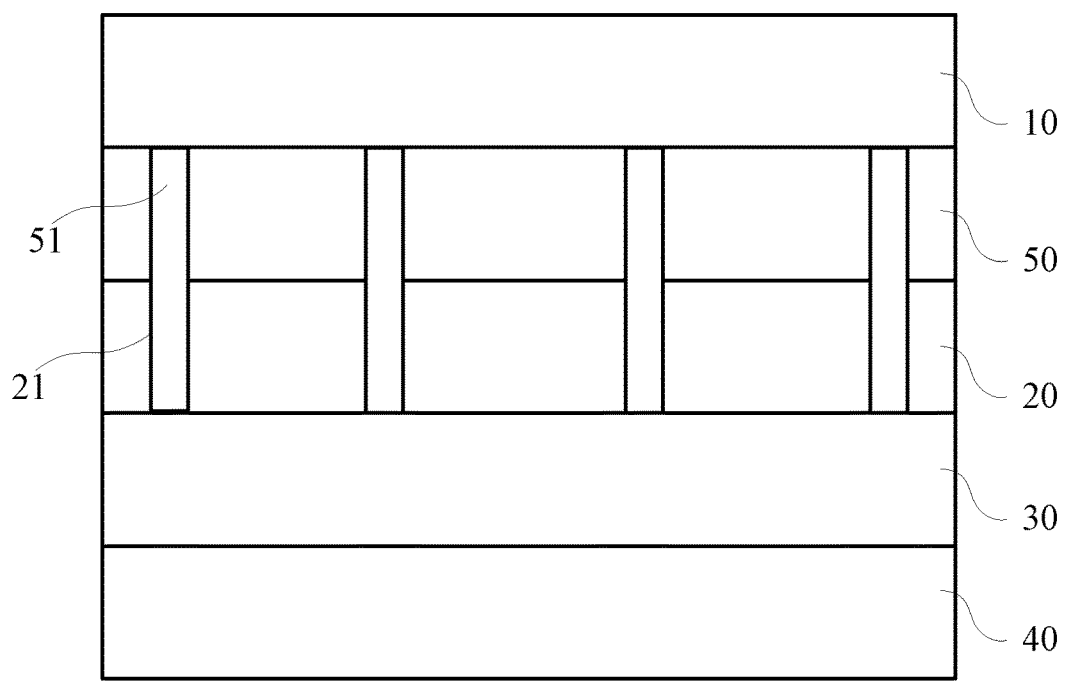
FIG. 5 is a schematic view of the organic light emitting diode device structure according to the embodiment of the present disclosure.

Further, referring to FIG. 5, FIG. 5 is a schematic view of the organic light emitting diode device 1 according to the other embodiment of the present disclosure. In other embodiment, the refractive index of the dielectric layer 50 is smaller than the refractive index of the organic layer 30. In this case, a via 51 is provided in the dielectric layer 50 is provided corresponding to the through hole 21, so that the partial of the light emitted from the organic layer 30 can pass through the through hole 21, the via 51 successively and directly to the glass substrate 10. Specifically, the via 51 is interlinked with the through hole 21.

Likewise, in this embodiment, the total area of the plurality of the through holes 51 is smaller than 30% of the total area of the dielectric layer 50 overlapping with the glass substrate 10. The present invention also provides a display apparatus includes the above described organic light emitting diode device 1.

The display apparatus and the organic light emitting diode device 1 are present in the disclosure, the anode layer 20 has a through hole 21 so that partial of the light emitted from the organic layer 30 can pass through the through hole 21 and directly to the glass substrate 10 in order to reduce the total reflection phenomenon in the contacting surface of the anode layer 20 and the of the glass substrate 10, thereby improving the light extraction efficiency of the organic light emitting diode device 1.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present disclosure has been explained above, it is not the limitation of the range, the sequence in practice, the material in practice, or the method in practice. Any modification or decoration for present disclosure is not detached from the spirit and the range of such.

What is claimed is:

1. An organic light emitting diode device, comprising:
a glass substrate, an anode layer, an organic layer and a cathode layer laminated sequentially, wherein the refractive index of the anode layer is larger than the refractive index of the glass substrate, wherein a through hole is formed in the anode layer so that partial of the incident light from the organic layer is extracted through the through hole to the glass substrate in order to reduce the total reflection phenomenon of the contracting surface of the anode layer and the glass substrate;
a dielectric layer is formed between the anode layer and the glass substrate;
the refractive index of the dielectric layer is smaller than the refractive index of the organic layer, and a via is provided in the dielectric layer corresponding to the through hole, so that the partial of the light emitted from the organic layer pass through the through hole, the via successively and directly to the glass substrate.

2. The organic light emitting diode device according to claim 1, wherein the diameter of the through hole is between 1 mm-1000 mm.

3. The organic light emitting diode device according to claim 1, wherein there is a plurality of through holes and evenly distributed in the anode layer.

4. The organic light emitting diode device according to claim 1, wherein the refractive index of the dielectric layer is larger than the refractive index of the organic layer.

5. The organic light emitting diode device according to claim 1, wherein the total area of the plurality of the through holes is smaller than 30% of the total area of the anode layer overlapping with the glass substrate.

6. The organic light emitting diode device according to claim 1, wherein the refractive index of the organic layer is smaller than the refractive index of the anode layer.

7. The organic light emitting diode device according to claim 1, wherein the refractive index of the glass substrate is 1.45, the refractive index of the anode layer is 1.9.

8. An organic light emitting diode device, comprising:

a glass substrate, an anode layer, an organic layer and a cathode layer laminated sequentially, wherein the refractive index of the anode layer is larger than the refractive index of the glass substrate, wherein a through hole is formed in the anode layer so that partial of the incident light from the organic layer can be extracted through the through hole to the glass substrate in order to reduce the total reflection phenomenon of the contracting surface of the anode layer and the glass substrate;

further comprising a dielectric layer formed between the anode layer and the glass substrate; and wherein the refractive index of the dielectric layer is smaller than the refractive index of the organic layer, and a via is provided in the dielectric layer corresponding to the through hole, so that the partial of the light emitted from the organic layer pass through the through hole, the via successively and directly to the glass substrate.

9. The organic light emitting diode device according to claim 8, wherein the diameter of the through hole is between 1 mm-1000 mm.

10. The organic light emitting diode device according to claim 8, wherein there is a plurality of through holes and evenly distributed in the anode layer.

11. The organic light emitting diode device according to claim 8, wherein the refractive index of the dielectric layer is larger than the refractive index of the organic layer.

12. The organic light emitting diode device according to claim 8, wherein the total area of the plurality of the through holes is smaller than 30% of the total area of the anode layer overlapping with the dielectric layer.

13. The organic light emitting diode device according to claim 8, wherein the refractive index of the organic layer is smaller than the refractive index of the anode layer.

14. The organic light emitting diode device according to claim 8, wherein the refractive index of the glass substrate is 1.45, the refractive index of the anode layer is 1.9.

15. A display apparatus comprising the organic light emitting diode device according to claim 14.

* * * * *